(12) United States Patent
Yang et al.

(10) Patent No.: US 11,550,220 B2
(45) Date of Patent: Jan. 10, 2023

(54) NEGATIVE TONE PHOTORESIST FOR EUV LITHOGRAPHY

(71) Applicant: TAIWAN SEMICONDUCTOR MANUFACTURING CO., LTD., Hsinchu (TW)

(72) Inventors: Li-Po Yang, Hsinchu (TW); Wei-Han Lai, New Taipei (TW); Ching-Yu Chang, Yilan County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/810,002

(22) Filed: Mar. 5, 2020

(65) Prior Publication Data

US 2021/0132497 A1    May 6, 2021

Related U.S. Application Data

(60) Provisional application No. 62/928,226, filed on Oct. 30, 2019.

(51) Int. Cl.
| | | |
|---|---|---|
| *G03F 7/038* | (2006.01) | |
| *G03F 7/20* | (2006.01) | |
| *G03F 7/30* | (2006.01) | |
| *G03F 7/16* | (2006.01) | |

(52) U.S. Cl.
CPC ............ G03F 7/038 (2013.01); G03F 7/2022 (2013.01); *G03F 7/16* (2013.01); *G03F 7/20* (2013.01); *G03F 7/30* (2013.01)

(58) Field of Classification Search
CPC ............................... G03F 7/038; G03F 7/0382
USPC ...................................................... 430/270.1
See application file for complete search history.

(56) References Cited

U.S. PATENT DOCUMENTS

| | | |
|---|---|---|
| 6,399,714 B1 | 6/2002 | Huang et al. |
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,217,099 B2 | 12/2015 | Gaddam et al. |
| 9,256,123 B2 | 2/2016 | Shih et al. |
| 9,529,268 B2 | 12/2016 | Chang et al. |
| 9,548,303 B2 | 1/2017 | Lee et al. |

(Continued)

FOREIGN PATENT DOCUMENTS

| | | |
|---|---|---|
| EP | 0954553 B2 | 11/1999 |
| EP | 3279728 A1 | 2/2018 |

(Continued)

OTHER PUBLICATIONS

English Machine Translation of JP2011053691A (Year: 2011).*

*Primary Examiner* — Duane Smith
*Assistant Examiner* — Nicholas E Brown
(74) *Attorney, Agent, or Firm* — Maschoff Brennan

(57) ABSTRACT

A negative tone photoresist and method for developing the negative tone photoresist is disclosed. For example, the negative tone photoresist includes a solvent, a dissolution inhibitor, and a polymer. The polymer includes a hydroxyl group. The polymer may be greater than 40 weight per cent of a total weight of the negative tone photoresist.

20 Claims, 7 Drawing Sheets

(56) References Cited

U.S. PATENT DOCUMENTS

| | | | |
|---|---|---|---|
| 11,009,791 B2 | 5/2021 | Tomiga et al. | |
| 2003/0039921 A1* | 2/2003 | Washio | G03F 7/0382 |
| | | | 430/270.1 |
| 2016/0147154 A1* | 5/2016 | Takizawa | G03F 7/0045 |
| | | | 430/311 |
| 2016/0282720 A1 | 9/2016 | Takahashi | |
| 2018/0107113 A1* | 4/2018 | Toida | C07C 39/15 |
| 2019/0137871 A1 | 5/2019 | Lee et al. | |
| 2019/0294043 A1 | 9/2019 | Asakawa | |
| 2019/0377261 A1 | 12/2019 | Sakita et al. | |
| 2020/0019058 A1* | 1/2020 | Hatakeyama | |

FOREIGN PATENT DOCUMENTS

| | | | | |
|---|---|---|---|---|
| JP | 2011053691 A | * | 3/2011 | B82Y 10/00 |
| JP | 2012-194348 A | | 10/2012 | |
| JP | 2012252080 A | | 12/2012 | |
| KR | 10-2005-0071802 A | | 7/2005 | |
| KR | 101877029 B1 | | 7/2018 | |
| TW | 201736953 A | | 10/2017 | |
| TW | 201837018 A | | 10/2018 | |
| TW | 201900698 A | | 1/2019 | |
| WO | 2018212079 A1 | | 11/2018 | |
| WO | WO-2018212079 A1 | * | 11/2018 | C08F 212/14 |

\* cited by examiner

NEGATIVE TONE PHOTORESIST FOR EUV LITHOGRAPHY

CROSS-REFERENCES TO RELATED APPLICATION

The present application claims the priority of U.S. Provisional Application No. 62/928,226, filed Oct. 30, 2019, which is incorporated herein in its entirety.

BACKGROUND

The semiconductor integrated circuit (IC) industry has experienced exponential growth. Technological advances in IC material and design have produced generations of ICs where each generation has smaller and more complex circuits than the previous generation. During the course of IC evolution, functional density (e.g., the number of interconnected devices per chip area) has generally increased while geometry size (e.g., the smallest component or line that can be created using an IC fabrication process) has decreased. This scaling down process generally provides benefits by increasing production efficiency and lowering associated costs. However, such scaling down has also increased the complexity of processing and manufacturing ICs.

One example process used to manufacture the ICs is lithography. Lithography is a process that is used to transfer IC patterns to a semiconductor wafer. In an example lithography process, a resist film is coated on a surface of a wafer and is subsequently exposed and developed to form a resist pattern. The resist pattern is then used to etch the wafer to form an IC pattern in the wafer. The quality of the resist pattern can directly impact the quality of the final IC.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
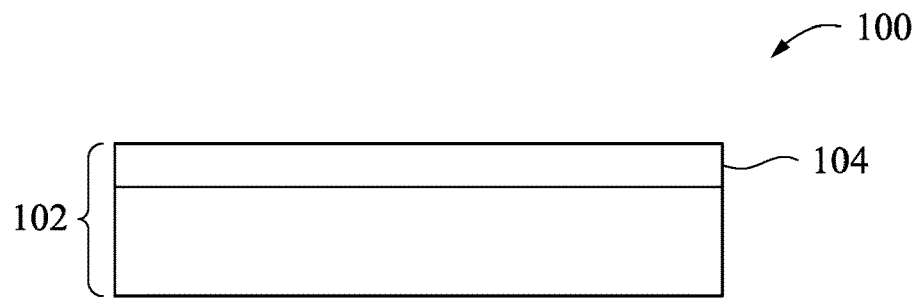
FIGS. 1A-1F are partial cross-sectional views of a wafer at various stages of manufacture according to at least one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

The present disclosure is related to various embodiments of a negative tone photoresist and methods for developing the same. In a lithography process, there may be two different types of processes for developing exposed resist films: a positive tone development (PTD) process and a negative tone development (NTD) process.

During the PTD process, the photoresist may be spun onto a wafer. A mask may be placed over the photoresist. The mask may include an IC pattern that is to be printed into the wafer. A radiation source (e.g., an ultraviolet light (UV) or extreme ultraviolet light (EUV) source) may be applied to the photoresist through the mask. Portions of the photoresist that are not covered by the mask may be exposed to the radiation source.

In one embodiment, the photoresist in the PTD process may include a polymer (e.g., poly hydroxystyrene (PHS)) in amounts between 20 weight per cent (wt %) to 40 wt %. The polymer may include an acid labile group (ALG) that may leave the polymer during exposure to the radiation source. When the ALG group leaves the polymer, the portions of the photoresist that are exposed to the radiation source may be become more hydrophilic than the portions of the photoresist that are not exposed to the radiation source. This allows the exposed portions of the photoresist to be soluble in a positive tone developer, such as a solution of tetra methylammonium hydroxide (TMAH), and easily removed by the TMAH solution.

It may be desirable to reduce the amount of energy applied by the radiation source to make the process to develop the photoresist more efficient. PHS is a weak acid and as the ratio of the PHS increases in the photoresist, the photoresist may be more sensitive to the radiation source. However, for the PTD process, adding more PHS may cause the solubility of the photoresist to be enhanced and dissolve more easily when exposed to the TMAH solution. Thus, the TMAH solution may develop too much of the photoresist, which can degrade the lithography performance (e.g., line width roughness, local critical dimension uniformity, and the like).

The present disclosure takes the disadvantage caused by the increase of the polymer ratio in the photoresist in the PTD process to improve the NTD process. For example, the increased sensitivity due to the increase in the ratio of polymer in the photoresist may allow lower amounts of energy (e.g., 20 milli-Joules (mJ) to 30 mJ as opposed to 40 MJ or more that are currently used) to be applied to the exposed portions of the photoresist.

FIGS. 1A-1F illustrate partial cross-sectional views of a wafer at various stages of a NTD process according to at least one embodiment of the present disclosure. It should be noted that additional operations can be provided before, during, or after each stage of the operation illustrated in FIGS. 1A-1F.

FIG. 1A illustrates a cross-sectional view of a semiconductor device 100. The semiconductor device 100 may be an intermediate device fabricated during processing of an IC, or a portion thereof. The semiconductor device may comprise static random access memory (SRAM) and/or logic circuits, passive components such as resistors, capacitors, and inductors, and active components such as p-type field effect transistors (PFETS), n-type FETs (NFETs), fin-like FETs (FinFETs), other multi-gate FETs, complementary metal-oxide semiconductor (CMOS) transistors, bipolar transistors, high voltage transistors, high frequency transistors, other active devices, and combinations thereof.

In one embodiment, the semiconductor device 100 may include a substrate 102. The substrate 102 may include one more layers of material or composition. In one embodiment, the substrate 102 may be a semiconductor substrate (e.g., a wafer). In one embodiment, the substrate 102 may include silicon in a crystalline structure. In one embodiment, the substrate 102 may include other elementary semiconductors such as germanium, a compound semiconductor such as silicon carbide, gallium arsenide, indium arsenide, indium phosphide, or an alloy semiconductor such as silicon germanium carbide, gallium arsenic phosphide, gallium indium phosphide, and the like. In one embodiment, the substrate 102 may include a silicon on insulator (SOI) substrate, be strained and/or stressed for performance enhancement, include epitaxial regions, include isolation regions, include doped regions, include one or more semiconductor devices or portions thereof, include conductive and/or non-conductive layers, or any other suitable features.

In one embodiment, the substrate 102 may include a patterning layer 104. In one embodiment, the patterning layer 104 may be a hard mask layer that includes materials such as silicon, silicon oxide, silicon nitride, silicon oxynitride, silicon carbon nitride, silicon carbide, titanium nitride, and the like. The patterning layer 104 may include a high-k dielectric layer, a gate layer, a hard mask layer, an interfacial layer, a capping layer, a diffusion/barrier layer, a dielectric layer, a conductive layer, and the like.

Figure 1B:
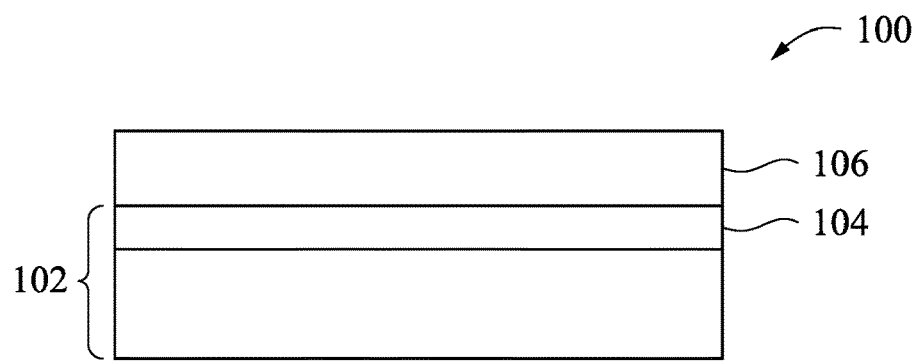

In FIG. 1B, a negative tone photoresist 106 of the present disclosure may be spun onto the patterning layer 104 of the substrate 102. The negative tone photoresist 106 may be formed by spin-on coating the negative tone photoresist 106 onto the substrate 102. In one embodiment, the negative tone photoresist 106 may be further processed or treated with a soft baking process, a hard baking process, or a combination thereof.

In one embodiment, the negative tone photoresist 106 of the present disclosure may contain large amounts of a photosensitive polymer. For example, the polymer may be a polymer with an ALG or a hydroxyl group. In one embodiment, the negative tone photoresist 106 may include over 40 wt % of the polymer to increase the sensitivity of the negative tone photoresist 106 to radiation. For example, the negative tone photoresist 106 may include approximately 40 wt % to 60 wt % of the polymer.

As discussed above, negative side effects may occur when too much of the polymer (e.g., greater than 40 wt %) is included in the positive tone photoresist for the PTD process. For example, the positive tone photoresist may become too developed (e.g., too much of the positive tone photoresist is removed by the developer) and create lithography issues. Thus, the amount of polymer that can be used in the positive tone photoresist may be limited, which may limit the amount of energy reduction for the PTD process.

In contrast, for the NTD process, the amount of polymer in the negative tone photoresist 106 can be increased to allow the portions of the negative tone photoresist 106 that will be developed to be more easily removed. As a result, a lower amount of radiation energy or UV light may be applied to develop the negative tone photoresist 106. For example, instead of using up to 40 milli-Joules of energy, the negative tone photoresist 106 of the present disclosure can be developed with as little as 20 milli-Joules to 30 milli-Joules of radiation energy.

In addition, as noted above, the polymer (e.g., PHS) in the negative tone photoresist 106 may create a weak acid when exposed to the radiation energy. The higher the concentration of the polymer that is contained in the negative tone photoresist 106, the greater the amount of weak acids that may be generated during exposure to the radiation energy.

The weak acids may react with dissolution inhibitors, or cross linking units, in the negative tone photoresist 106. The cross-linking reactions may increase the molecular weight of the negative tone photoresist 106 and allow the exposed portions of the negative tone photoresist 106 to be more resistant to being developed. Thus, an increase in the amount of polymer in the negative tone photoresist 106 may also improve the contrast in addition to a reduction of the amount of energy that is used.

In one embodiment, the negative tone photoresist may include a polymer, a dissolution inhibitor, polyethylene glycol (PEG), and a quencher that is mixed in a solvent. The polymer may be any type of photo acid generator (PAG) that includes an acid labile group (ALG). When the PAG is exposed to radiation, the ALG may be cleaved from the backbone of the PAG to form weak acids. This may increase the solubility of the polymer in the developer.

Figure 2:
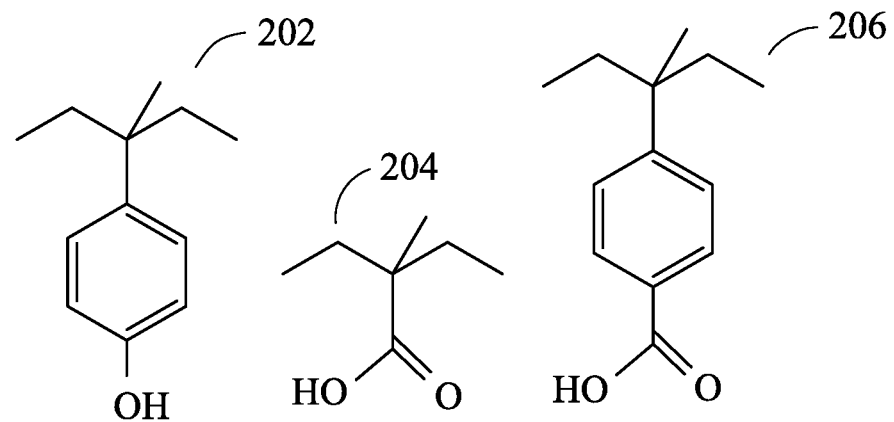
FIG. 2 illustrates example polymers used for a negative tone photoresist according to at least one embodiment of the present disclosure.

In one embodiment, the polymer may comprise a hydroxyl group (OH). FIG. 2 illustrates examples of polymers 202, 204, and 206 that can be used for the negative tone photoresist 106. For example, the polymer 202 may be poly hydroxystyrene (PHS), the polymer 204 may be poly acrylic acid (PAA), and the polymer 206 may be poly benzoic acid (PBA). It should be noted that the polymers 202, 204, and 206 are a few examples, but any type of polymer that can be a PAG can create ALGs.

In one embodiment, the dissolution inhibitor may comprise cross-linking units that allow hydroxyl radicals formed from exposure of the polymers to a radiation source to cross-link to the cross-linking units. The cross-linking reactions may help increase the molecular weight of the portions of the negative tone photoresist 106 that are exposed to the radiation source such that the exposed portions are more resistant to the developer.

In one embodiment, the negative tone photoresist 106 may contain greater than 5 wt % of the dissolution inhibitor. For example, the negative tone photoresist 106 may contain 5-10 wt % of the dissolution inhibitor. Adding relatively large amounts of the dissolution inhibitor may improve the amount of cross-linking reactions that occur. The cross-linking reactions can improve the resistance of the exposed portions of the negative tone photoresist 106 to the developer.

Figure 5:
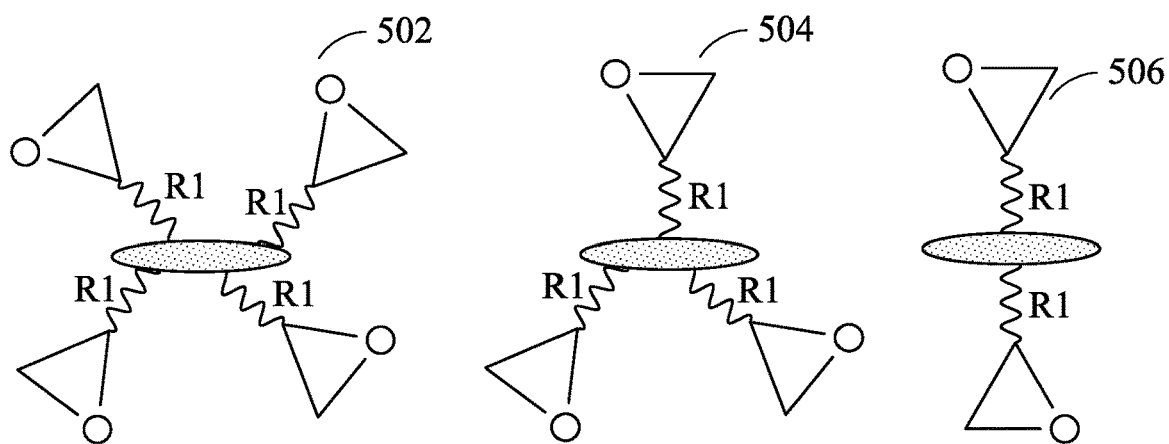
FIG. 5 illustrates examples of dissolution inhibitors having an epoxy group according to at least one embodiment of the present disclosure.

FIGS. 5-8 illustrate examples of the dissolution inhibitor that can be used. The dissolution inhibitors may include two or more cross-linking sites. FIG. 5 illustrates dissolution inhibitors 502, 504, and 506 that contain an epoxy-group. The dissolution inhibitor 502 may contain four cross-linking sites, the dissolution inhibitor 504 may contain three cross-linking sites, and the dissolution inhibitor 506 may contain two cross-linking sites. R1 in the dissolution inhibitors 502, 504, and 506 may be a C2-C20 alkyl group, cycloalkyl group, hydroxylalkyl group, cycloalkyl carboxyl group, a carbon (C)2-C20 saturated or unsaturated hydrocarbon ring, or a C2-C20 heterocyclic group. The R1 chain may be rotatable to achieve a high cross-link reaction efficiency in the exposed areas of the negative tone photoresist 206.

Figure 6:
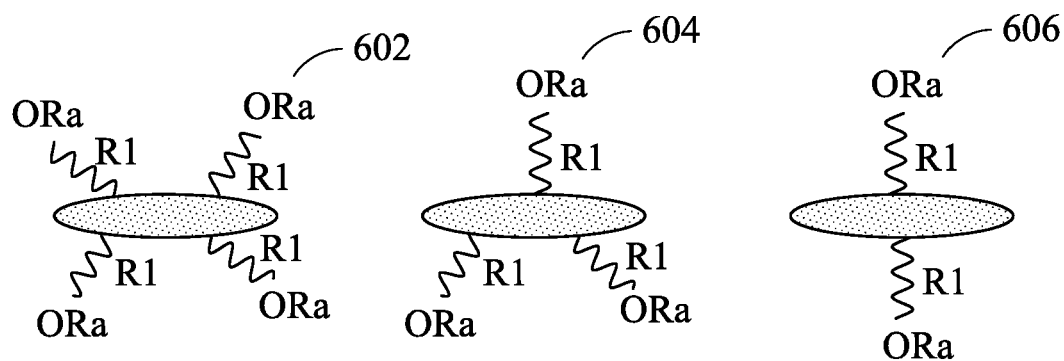
FIG. 6 illustrates examples of dissolution inhibitors having a hydroxy-group according to at least one embodiment of the present disclosure.

FIG. 6 illustrates dissolution inhibitors 602, 604, and 606 that contain a hydroxy-group. The dissolution inhibitor 602 may contain four cross-linking sites, the dissolution inhibitor 604 may contain three cross-linking sites, and the dissolution inhibitor 606 may contain two cross-linking sites. R1 in the dissolution inhibitors 602, 604, and 606 may be a C2-C20 alkyl group, cycloalkyl group, hydroxylalkyl group, cycloalkyl carboxyl group, a C2-C20 saturated or unsaturated hydrocarbon ring, or a C2-C20 heterocyclic group. The R1 chain may be rotatable to achieve a high cross-link reaction efficiency in the exposed areas of the negative tone photoresist 106. Ra in the dissolution inhibitors 602, 604, and 606 may be hydrogen (H) or C1-C8 alkyl group, cycloalkyl group, hydroxylalkyl group, cycloalkyl carboxyl group, a C1-C8 saturated or unsaturated hydrocarbon ring, or a C1-C8 heterocyclic group.

Figure 7:
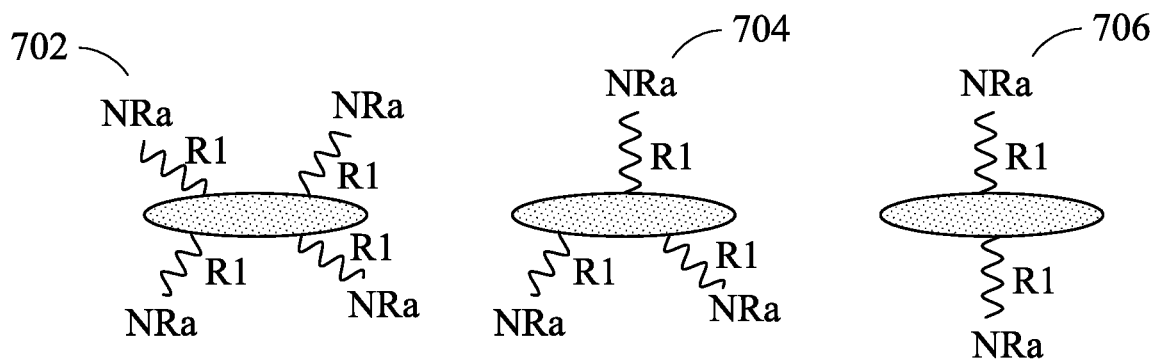
FIG. 7 illustrates examples of dissolution inhibitors having a melamine group according to at least one embodiment of the present disclosure.

FIG. 7 illustrates dissolution inhibitors 702, 704, and 706 that contain a melamine group. The dissolution inhibitor 702 may contain four cross-linking sites, the dissolution inhibitor 704 may contain three cross-linking sites, and the dissolution inhibitor 706 may contain two cross-linking sites. R1 in the dissolution inhibitors 702, 704, and 706 may be a C2-C20 alkyl group, cycloalkyl group, hydroxylalkyl group, cycloalkyl carboxyl group, a C2-C20 saturated or unsaturated hydrocarbon ring, or a C2-C20 heterocyclic group. The R1 chain may be rotatable to achieve a high cross-link reaction efficiency in the exposed areas of the negative tone photoresist 106. Ra in the dissolution inhibitors 702, 704, and 706 may be hydrogen (H) or C1-C8 alkyl group, cycloalkyl group, hydroxylalkyl group, cycloalkyl carboxyl group, a C1-C8 saturated or unsaturated hydrocarbon ring, or a C1-C8 heterocyclic group.

Figure 8:
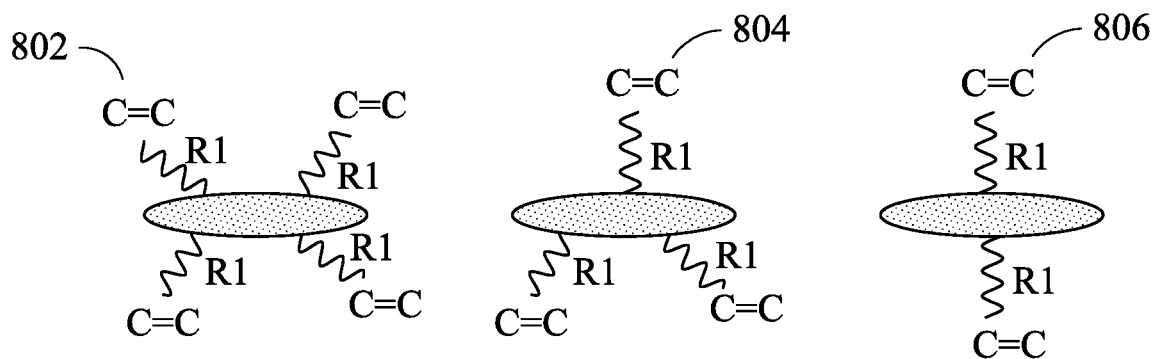
FIG. 8 illustrates examples of dissolution inhibitors having an alkene group according to at least one embodiment of the present disclosure.

FIG. 8 illustrates dissolution inhibitors 802, 804, and 806 that contain an alkene group. The dissolution inhibitor 802 may contain four cross-linking sites, the dissolution inhibitor 804 may contain three cross-linking sites, and the dissolution inhibitor 806 may contain two cross-linking sites. R1 in the dissolution inhibitors 802, 804, and 806 may be a C2-C20 alkyl group, cycloalkyl group, hydroxylalkyl group, cycloalkyl carboxyl group, a carbon (C)2-C20 saturated or unsaturated hydrocarbon ring, or a C2-C20 heterocyclic group. The R1 chain may be rotatable to achieve a high cross-link reaction efficiency in the exposed areas of the negative tone photoresist 106.

The PEG may help provide adhesion of the negative tone photoresist 106 to the patterning layer 104. The quencher may be a basic quencher that functions as a stoichiometric neutralizer of the PAG that is generated by the polymers.

The solvent may allow the components of the negative tone photoresist 106 to be coated or spun onto the patterning layer 104. For example, the solvent may include 2-methoxy-1-methylethyl acetate (PGMEA), butyl acetate, ethyl lactate, and the like.

Referring back to FIG. 1B, additional process steps can be performed that are not shown. For example, prior to applying the negative tone photoresist 106 onto the patterning layer 104 an anti-reflective coating (ARC) layer may be formed over the patterning layer 104. The ARC layer may be a nitrogen-free anti-reflective coating (NFARC) that includes a material such as silicon oxide ($SiO_2$), silicon oxygen carbide (SOC), plasma enhanced chemical vapor deposited silicon oxide (PECVD-$SiO_2$), other suitable materials, or any combination thereof. Additional layers may also be formed between the patterning layer 104 and the negative tone photoresist 106.

Figure 10:
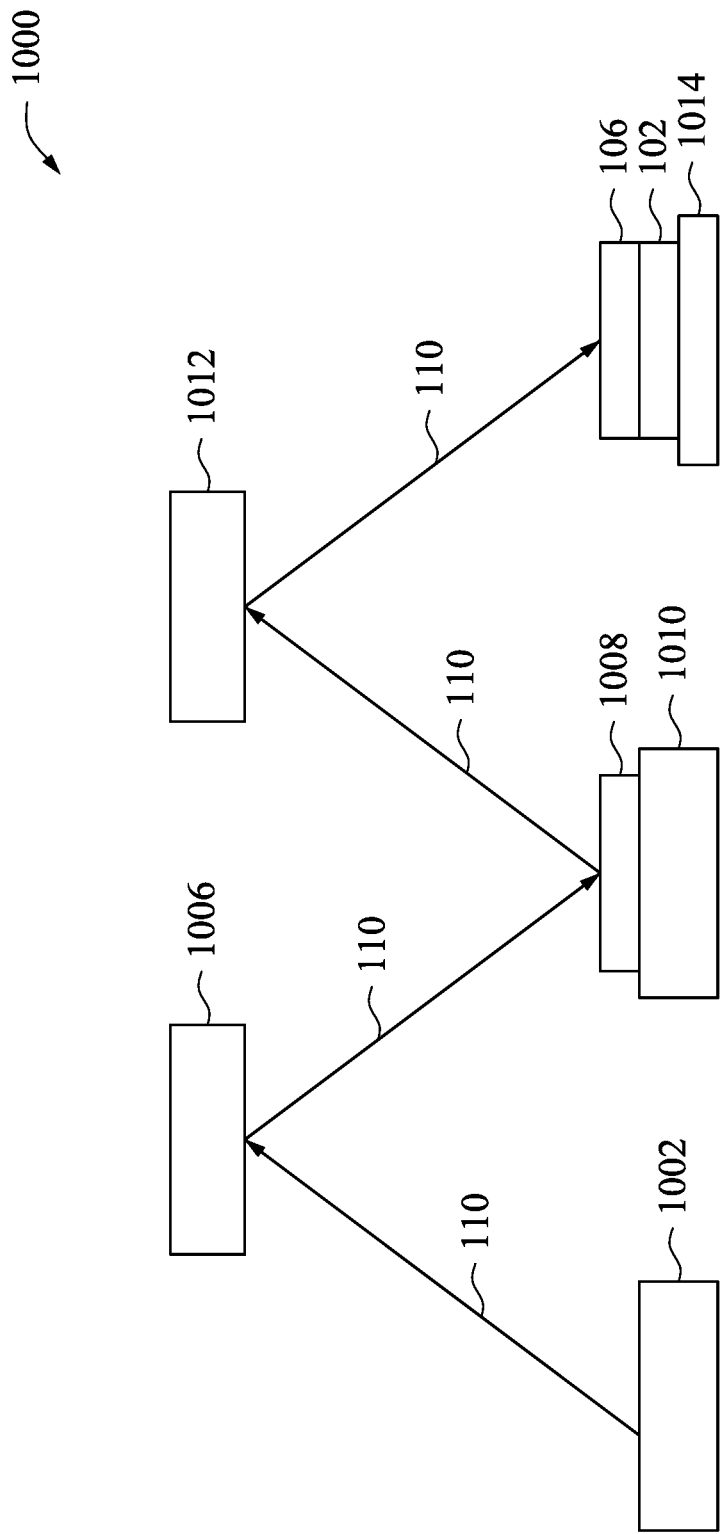
FIG. 10 illustrates an example EUV lithography system according to at least one embodiment of the present disclosure.

FIG. 10 how the negative tone photoresist 106 is exposed to a radiation beam 110 (e.g., an ultraviolet (UV) light source, an extreme UV (EUV) light source, a laser, and the like) in a lithography system 1000. The radiation beam 110 may be any type of light source or radiation source. For example, the radiation beam 110 may be an I-line (365 nanometers (nm)), a deep UV radiation such as KrF excimer laser (248 nm) or ArF excimer laser (193 nm), an EUV radiation (e.g., 13.8 nm), an e-beam, an x-ray, an ion beam, or other suitable radiations.

The operation illustrated in FIG. 10 may be performed in air, in a liquid (immersion lithography), or in a vacuum (e.g., for EUV lithography and e-beam lithography). In an embodiment, the radiation beam 110 is patterned with a mask having IC patterns, such as a transmissive mask or a reflective mask, which may include resolution enhancement techniques such as phase-shifting and/or optical proximity correction (OPC). In another embodiment, the radiation beam 110 is directly modulated with IC patterns without using a mask (maskless lithography). In the present embodiment, the radiation beam 110 is an EUV radiation and the lithography system 1000 is an EUV lithography system. An embodiment of the EUV lithography system 1000 is shown in FIG. 10.

Referring to FIG. 10, the EUV lithography system 1000 includes a radiation source 1002 that produces the radiation beam 110, condenser optics 1006, a mask stage 1010 securing a mask 1008 thereon, projection optics 1012, and a substrate stage 1014 securing the device 100 including the substrate 102 and the negative tone photoresist 106. Other configurations and inclusion or omission of items may be possible. In the present disclosure, the EUV lithography system 1000 may be a stepper or a scanner.

The radiation source 1002 provides the radiation beam 110 having a wavelength in the EUV range, such as about 1-100 nm. In an embodiment, the radiation beam 110 has a wavelength of about 13.5 nm. As noted above, due to the composition of the negative tone photoresist 106 of the present disclosure, the negative tone photoresist 106 may be more sensitive to the radiation beam 110. As a result, the amount of energy applied by the radiation source 1002 may be reduced. For example, the radiation source 1002 may apply approximately 20 milli-Joules-30 milli-Joules of energy instead of 40 milli-Joules or more that was previously used.

The condenser optics 1006 includes a multilayer coated collector and a plurality of grazing mirrors. The condenser optics 1006 is configured to collect and shape the radiation beam 110 and to provide a slit of the radiation beam 110 to the mask 1008. The mask 1008, also referred to as a photomask or a reticle, includes patterns of one or more target IC devices. The mask 1008 provides a patterned aerial image to the radiation beam 110. The mask 1008 is a reflective mask in the present embodiment, and may incorporate resolution enhancement techniques such as phase-shifting techniques and/or optical proximity correction (OPC). The mask stage 1010 secures the mask 1008 thereon, such as by vacuum, and provides accurate position and movement of the mask 1008 during alignment, focus, leveling, and exposure operations in the EUV lithography system 1000.

The projection optics 1012 includes one or more lenses and a plurality of mirrors. The lens may have a magnification of less than one thereby reducing the patterned aerial image of the mask 1008 to the device 100, particularly, to the negative tone photoresist 106. The device 100 is secured by the substrate stage 1014 which provides accurate position and movement of the device 100 during alignment, focus, leveling, and exposing operations in the EUV lithography system 1000 such that the patterned aerial image of the mask 1008 is exposed onto the negative tone photoresist 106 in a repetitive fashion (though other lithography methods are possible). The exposed portions of the negative tone photoresist 106 become insoluble in a developer, while the unexposed portions are removed by the developer.

Figure 1C:
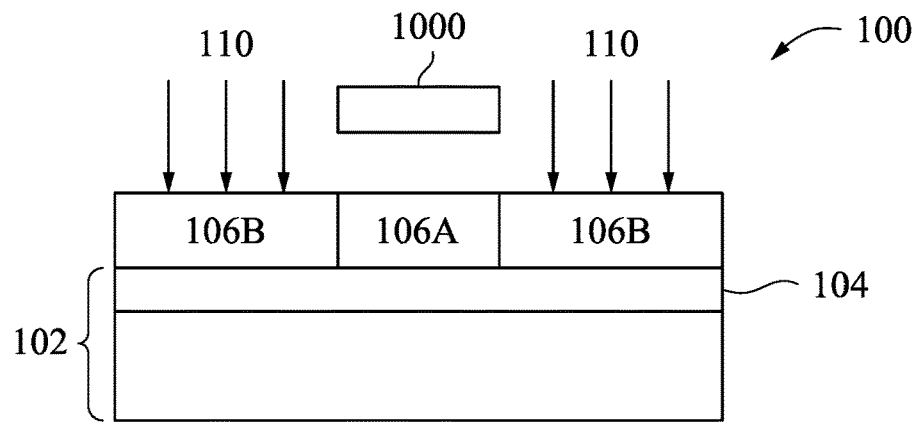

As shown in FIG. 1C, portions 1068 of the negative tone photoresist 106 may be exposed by the radiation beam 110. As noted above, due to the large amounts of polymer (e.g., greater than 40 wt %) in the negative tone photoresist 106, the negative tone photoresist may be more sensitive to the radiation beam 110. As a result, a lower dosage or lower amount of energy can be applied by the radiation beam 110 to generate the weak acid from the polymers and create cross-linking reactions in the negative tone photoresist 106.

Figure 3:
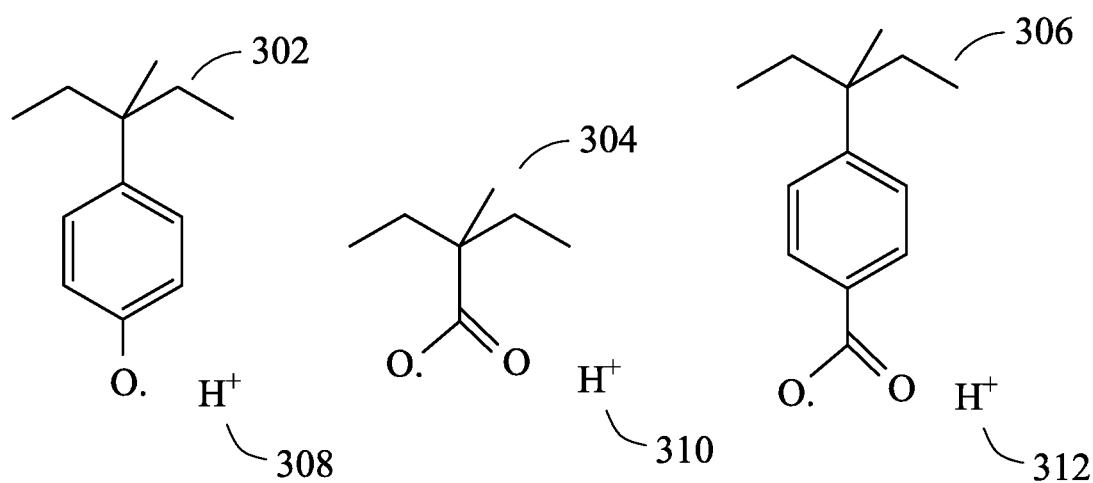
FIG. 3 illustrates examples of the photo acids formed from the example polymers according to at least one embodiment of the present disclosure.

For example, the exposure by the radiation beam 110 may create an acid and hydroxyl radical from the polymer contained in the negative tone photoresist 106 as shown in FIG. 3. FIG. 3 illustrates the example hydroxyl radicals 302, 304 and 306 formed by exposure of the polymers 202, 204, and 206 to the radiation beam 110. In addition, FIG. 3 illustrates the formation of an acid 308, 310, and 312. The acid 308, 310, and 312 may be neutralized by the basic quencher contained in the negative tone photoresist 106.

Figure 4:
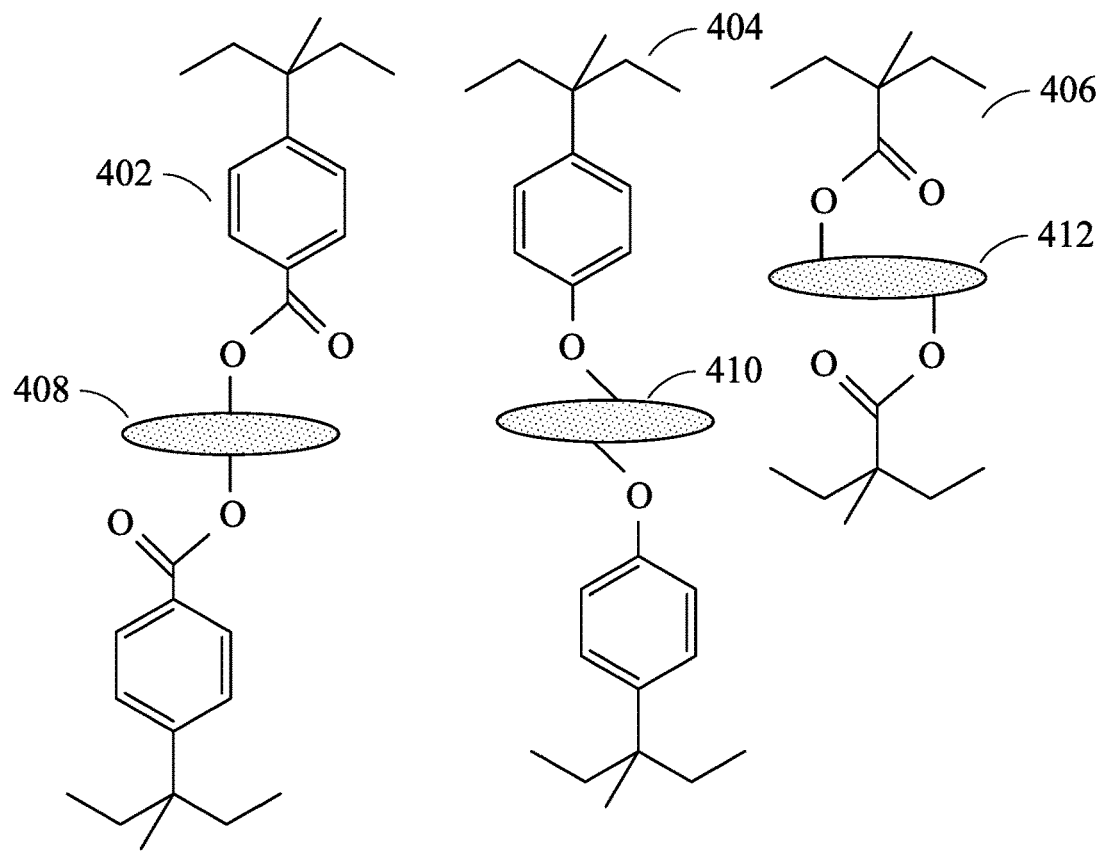
FIG. 4 illustrates examples of cross-linked polymers according to at least one embodiment of the present disclosure.

In one embodiment, the hydroxyl radicals 302, 304, and 306 can then react with the dissolution inhibitors (e.g., the dissolution inhibitors illustrated in FIGS. 5-8 and described above) or cross-linking units 408, 410, and 412 illustrated in FIG. 4. For example, the hydroxyl radical 302 may react with the cross-linker 408 to form the cross-linked compound 402. The hydroxyl radical 304 may react with the cross-linker 410 to form the cross-linked compound 404. The hydroxyl radical 306 may react with the cross-linker 412 to form the cross-linked compound 406.

Figure 1D:
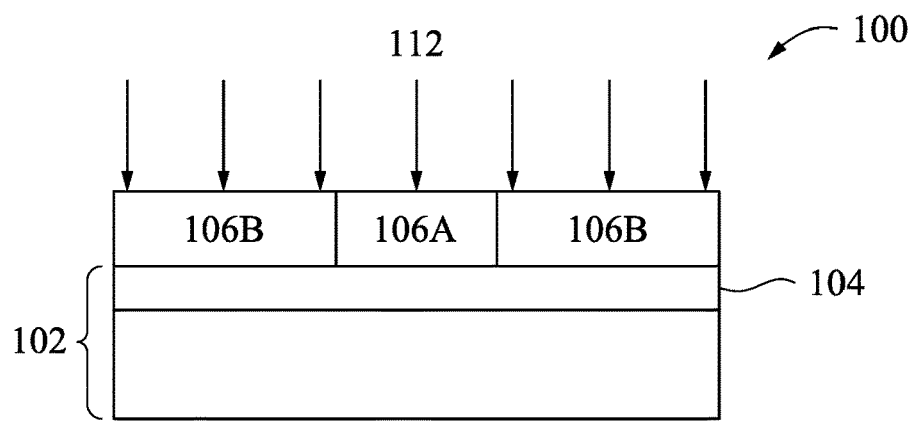

FIG. 1D illustrates how the negative tone photoresist 106 may be developed. A developer 112 may be applied to both the exposed portions 106B and the unexposed portions 106A. In one embodiment, the developer may be TMAH. However, due to the composition of the negative tone photoresist 106 (e.g., an amount of greater than 40 wt % of the polymer) additional types of organic solvents may be used to develop the unexposed portions 106A of the negative tone photoresist 106. Additional types of organic solvents that can be used as the developer 112 may include butyl acetate, a mixture of 70 per cent glycol monomethylether and 30 per cent propylene glycol monomethylether acetate, and the like.

In one embodiment, the developer 112 may be applied in a developer tool. For example, the device 100 may be transferred to the developer tool. The device 100 may be secured on a stage or chuck of the developer tool. The device 100 may be held or spun while the developer 112 is sprayed onto the negative tone photoresist 106. The developer 112 may be sprayed continuously or by other means such as a puddle developing process. After the negative tone photoresist 106 is developed, the remaining portions 106B may be rinsed with deionized (DI) water to remove particles or residue. The remaining portions 106B may also be subjected to a post-development baking (PDB) process to harden the remaining portions 106B that form the resist pattern so as to increase its structural stability.

Figure 1E:
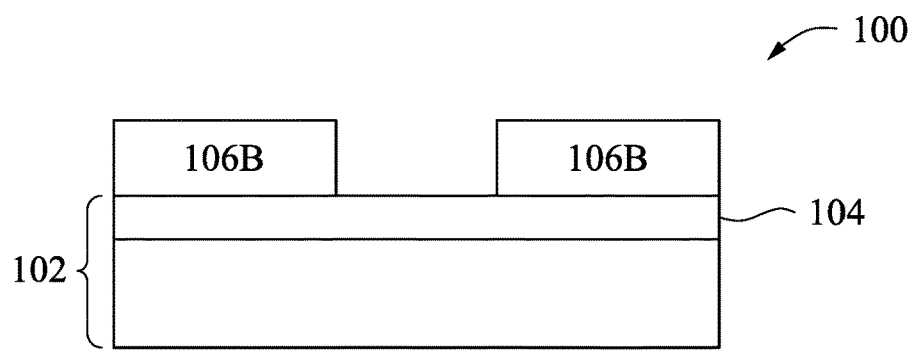

FIG. 1E illustrates a resulting resist pattern that is formed in the negative tone photoresist 106. For example, after the developer 112 is applied, the exposed portions 106B may remain on the patterning layer 104. Due to the increased number of cross-linked reactions in the exposed portions 106B, the remaining exposed portions 106B may be resistant to the developer 112. As a result, the remaining exposed portions 106B may have very smooth edges and sidewalls (e.g., a low line edge roughness and a low line width roughness) and be well defined (e.g., have a high developing contrast).

The IC pattern from the remaining portions 106B of the negative tone photoresist 106 may be transferred to patterning layer 104 of the substrate 102. For example, the IC pattern may be transferred via an etching operation that uses the remaining portions 106B as an etch mask. The etching operation may include a dry (plasma) etch, a wet etch, and/or any other etching methods.

Figure 1F:
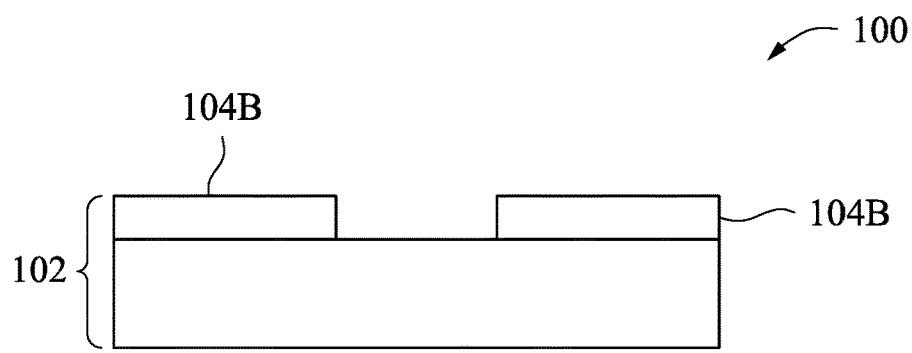

For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; tetramethylammonium hydroxide (TMAH); a solution containing hydrofluoric acid (HF), nitric acid ($HNO_3$), and/or acetic acid ($CH_3COOH$); or other suitable wet etchant. The remaining portion 106B of the negative tone photoresist 106 may be partially or completely consumed during the etching of the patterning layer 104. In an embodiment, any remaining portion of the remaining portion 106B may be stripped off, leaving a patterned layer 104B over the substrate 102, as illustrated in FIG. 1F.

In one embodiment, the device 100 may proceed to final pattern or an IC device on the substrate 102. In an embodiment, the substrate 102 is a semiconductor substrate and substrate 102 may proceed to additional processing to form fin field effect transistor (FinFET) structures. For example, a plurality of active fins may be formed in the semiconductor substrate 102. The active fins have uniform critical dimension (CD), due to the low LER and LWR of the pattern formed by remaining portions 106B of the negative tone photoresist 106.

In another embodiment, the substrate 102 may proceed to operations to form a plurality of gate electrodes in the semiconductor substrate 102. The gate electrodes have uniform gate length due to the smooth sidewalls of the pattern formed by remaining portions 106B of the negative tone photoresist 106. In another embodiment, a target pattern is to be formed as metal lines in a multilayer interconnection structure. For example, the metal lines may be formed in an inter-layer dielectric (ILD) layer of the substrate 102, which has been etched by operation 110 to include a plurality of trenches.

The substrate 102 may then proceed to operations to fill the trenches with a conductive material, such as a metal; and polish the conductive material using a process such as chemical mechanical planarization (CMP) to expose the patterned ILD layer, thereby forming the metal lines in the ILD layer. The above are non-limiting examples of devices/structures that can be made and/or improved using the negative tone photoresist 106 of the present disclosure according to various aspects of the present disclosure.

Figure 9:
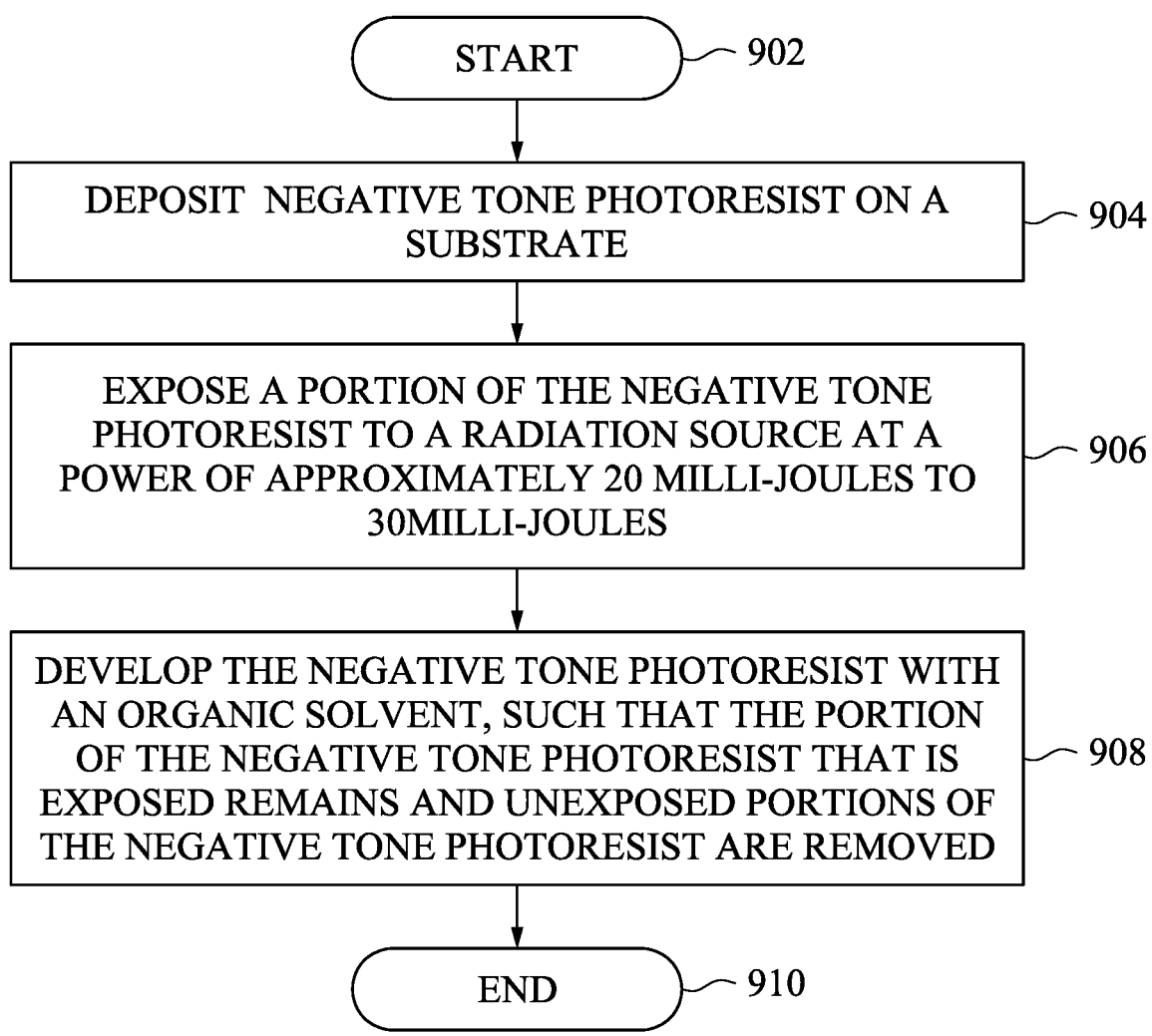
FIG. 9 illustrates a flowchart of a method for developing a negative tone photoresist according to at least one embodiment of the present disclosure.

FIG. 9 illustrates a flowchart of a method 900 of developing a negative tone photoresist according to at least one embodiment of the present disclosure. The method 900 may be performed via a lithography tool or developer under the control of a controller or processor.

While the method 900 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The method 900 begins at block 902. At block 904, the method 900 deposits the negative tone photoresist on a substrate. In one embodiment, the negative tone photoresist may be spun onto a patterning layer of the substrate. The negative tone photoresist may comprise a solvent, a dissolution inhibitor (e.g., cross-linking units), a polymer, PEG, and a basic quencher. In one embodiment, the polymer may be a polymer that includes a hydroxyl group. The polymer may be more than 40 wt % of the total amount of the negative tone photoresist. In one embodiment, the polymer may be approximately 40 wt % to 60 wt %. In one embodiment, the polymer may be PHS, PBA, PAA, and the like.

In one embodiment, the negative tone photoresist may include greater than 5 wt % of the dissolution inhibitor. In one embodiment, the negative tone photoresist may include approximately 5-10 wt % of the dissolution inhibitor. The dissolution inhibitor may include two or more cross-linking sites. The dissolution inhibitor may include at least one rotatable chain of carbon atoms that allows a high cross-link reaction efficiency to be achieved in the exposed areas of the negative tone photoresist. The dissolution inhibitor may include an epoxy-group, a hydroxyl-group, a melamine-group or an alkene group, as illustrated in FIGS. 5-8 and discussed above.

As discussed above, the high amount of polymers in the negative tone photoresist allows the negative tone photoresist to be more sensitive to radiation. As a result, a lower dose, and thereby lower amounts of energy, may be applied by the radiation source. The high amounts of negative tone photoresist may also create more acid and hydroxyl radicals. The large amount hydroxyl radicals with the larger amount of dissolution inhibitors can create more cross-linking reactions. The large amount of cross-linking reactions in the negative tone photoresist may allow the exposed portions of the negative tone photoresist to be more resistant to the developer.

At block 906, the method 900 exposes a portion of the negative tone photoresist to a radiation source at a power of approximately 20 milli-Joules to 30 milli-Joules. As noted above, the large amount of polymer (e.g., greater than 40 wt %) in the negative tone photoresist may allow the negative tone photoresist to be more sensitive to the radiation. As a result, a lower dose or lower amount of energy may be applied to the negative tone photoresist. The radiation source may be a UV light, an EUV light, a laser, and the like.

At block 908, the method 900 develops the negative tone photoresist with an organic solvent, such that the portion of the negative tone photoresist that is exposed remains and unexposed portions of the negative tone photoresist are removed. In one embodiment, due to the composition of the negative tone photoresist, additional types of organic solvents that were not previously used for the NTD process may be used. For example, the organic solvents may include TMAH, butyl acetate, a mixture of 70 per cent glycol monomethylether and 30 per cent propylene glycol monomethylether acetate, and the like.

After the negative tone photoresist is developed, a pattern formed by the negative tone photoresist may be used to transfer a pattern of ICs onto a substrate. The patterned negative tone photoresist may then be removed and the substrate may continue for additional processing to form the final IC device. At block 910, the method 900 ends.

Therefore, the present disclosure relates to a negative tone photoresist and method for developing the same. In some embodiments, the present disclosure relates to a negative tone photoresist that uses less radiation energy. For example, the negative tone photoresist comprises a solvent, a dissolution inhibitor, and a polymer. The polymer may comprise a hydroxyl group. The polymer may comprise greater than 40 wt % of a total weight of the negative tone photoresist.

In other embodiments, the present disclosure relates to a negative tone photoresist that uses less radiation energy and improves the resistance of the exposed negative tone photoresist to a developer. The negative tone photoresist comprises a solvent, a dissolution inhibitor and a polymer. The dissolution inhibitor comprises greater than 5 weight per cent (wt %) of a total weight of the negative tone photoresist. The polymer comprises a hydroxyl group and comprises greater than 40 wt % of the total weight of the negative tone photoresist.

In yet other embodiments, the present disclosure relates to a method for developing a negative tone photoresist of the present disclosure. For example, the method comprises depositing the negative tone photoresist on a substrate. A portion of the negative tone photoresist is then exposed to a radiation source. The radiation source may be applied at a power of approximately 20 milli-Joules to 30 milli-Joules. After exposure, the negative tone photoresist is developed with an organic solvent. The portion of the negative tone photoresist that is exposed remains and the unexposed portions of the negative tone photoresist are removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A negative tone photoresist prepared from materials consisting of:
   a solvent;
   a dissolution inhibitor;
   a polymer dissolved in the solvent and comprising a repeating unit, wherein the repeating unit comprises a photo-decomposable group selected from a hydroxyl group and a carboxyl group, and a content of the repeating unit comprises between 40 weight per cent (wt %) to 60 wt % of a total solid weight of the negative tone photoresist;
   a polyethylene glycol (PEG); and
   a quencher.

2. The negative tone photoresist of claim 1, wherein the polymer comprises poly hydroxystyrene.

3. The negative tone photoresist of claim 1, wherein the polymer comprises poly benzoic acid.

4. The negative tone photoresist of claim 1, wherein the polymer comprises poly acrylic acid.

5. The negative tone photoresist of claim 1, wherein the dissolution inhibitor comprises a cross-linking unit with at least two cross-linking sites.

6. The negative tone photoresist of claim 1, wherein the dissolution inhibitor comprises 5 wt % to 10 wt % of the total solid weight of the negative tone photoresist.

7. A negative tone photoresist prepared from materials consisting of:
   a solvent;
   a dissolution inhibitor, wherein the dissolution inhibitor comprises greater than 5 weight per cent (wt %) of a total solid weight of the negative tone photoresist;
   a polymer dissolved in the solvent and comprising a repeating unit, wherein the repeating unit comprises a photo-decomposable group selected from a hydroxyl group and a carboxyl group, and a content of the repeating unit comprises greater than 40 weight per cent (wt %) of the total solid weight of the negative tone photoresist;
   a polyethylene glycol (PEG); and
   a quencher.

8. The negative tone photoresist of claim 7, wherein the polymer comprises less than 60 wt % of the total solid weight of the negative tone photoresist.

9. The negative tone photoresist of claim 7, wherein the polymer comprises at least one of: poly hydroxystyrene, poly benzoic acid, or poly acrylic acid.

10. The negative tone photoresist of claim 7, wherein the dissolution inhibitor comprises a cross-linking unit with at least two cross-linking sites.

11. The negative tone photoresist of claim 7, wherein the dissolution inhibitor comprises at least one epoxy group comprising at least one rotatable chain.

12. The negative tone photoresist of claim 7, wherein the dissolution inhibitor comprises at least one hydroxy-group comprising at least one rotatable chain.

13. The negative tone photoresist of claim 7, wherein the dissolution inhibitor comprises at least one melamine group comprising at least one rotatable chain.

14. The negative tone photoresist of claim 7, wherein the dissolution inhibitor comprises at least one alkene group comprising at least one rotatable chain.

15. A negative tone photoresist prepared from materials consisting of:
   a solvent;
   a dissolution inhibitor;
   a polymer dissolved in the solvent and comprising a composition selected from photo-decomposable poly hydroxystyrene, photo-decomposable poly benzoic acid, and photo-decomposable poly acrylic acid, wherein the composition comprises greater than 40 weight per cent (wt %) of a total solid weight of the negative tone photoresist;
   a polyethylene glycol (PEG); and
   a quencher.

16. The negative tone photoresist of claim 15, wherein the dissolution inhibitor comprises greater than 5 wt % of the total solid weight of the negative tone photoresist.

17. The negative tone photoresist of claim 15, wherein the dissolution inhibitor comprises at least one of: an epoxy group, a hydroxy-group, a melamine group, or an alkene group.

18. The negative tone photoresist of claim 15, wherein the dissolution inhibitor comprises:
   a first cross-linking unit comprising a first rotatable chain, wherein the first rotatable chain comprises C2-C20 alkyl group, cycloalkyl group, hydroxylalkyl group, cycloalkyl carboxyl group, a carbon (C)2-C20 saturated or unsaturated hydrocarbon ring, or a C2-C20 heterocyclic group; and
   a second cross-linking unit comprising a second rotatable chain, wherein the second rotatable chain comprises C2-C20 alkyl group, cycloalkyl group, hydroxylalkyl group, cycloalkyl carboxyl group, a carbon (C)2-C20 saturated or unsaturated hydrocarbon ring, or a C2-C20 heterocyclic group.

19. The negative tone photoresist of claim 18, wherein the dissolution inhibitor comprises:
   hydrogen (H) or C1-C8 alkyl group, cycloalkyl group, hydroxylalkyl group, cycloalkyl carboxyl group, a C1-C8 saturated or unsaturated hydrocarbon ring, or a C1-C8 heterocyclic group connected to the first rotatable chain of the first cross-linking unit.

20. The negative tone photoresist of claim 18, wherein the dissolution inhibitor comprises:
   hydrogen (H) or C1-C8 alkyl group, cycloalkyl group, hydroxylalkyl group, cycloalkyl carboxyl group, a C1-C8 saturated or unsaturated hydrocarbon ring, or a C1-C8 heterocyclic group connected to the second rotatable chain of the second cross-linking unit.

* * * * *